(12) United States Patent
Tsai et al.

(10) Patent No.: US 11,019,745 B2
(45) Date of Patent: May 25, 2021

(54) SEALING MEMBERS

(71) Applicant: HEWLETT-PACKARD DEVELOPMENT COMPANY, L.P., Spring, TX (US)

(72) Inventors: Cheng-Han Tsai, Taipei (TW); Chi-Chun Chiang, Taipei (TW); Chia-Ming Tsai, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 110 days.

(21) Appl. No.: 16/348,620

(22) PCT Filed: Feb. 7, 2017

(86) PCT No.: PCT/US2017/016779
§ 371 (c)(1),
(2) Date: May 9, 2019

(87) PCT Pub. No.: WO2018/147826
PCT Pub. Date: Aug. 16, 2018

(65) Prior Publication Data
US 2019/0357373 A1 Nov. 21, 2019

(51) Int. Cl.
*H05K 5/03* (2006.01)
*H05K 5/06* (2006.01)
(Continued)

(52) U.S. Cl.
CPC .............. *H05K 5/061* (2013.01); *F16J 15/02* (2013.01); *H01R 13/5202* (2013.01); *H01R 13/5213* (2013.01)

(58) Field of Classification Search
CPC .......... H02G 3/14; H02G 3/088; H02G 3/081; H02G 3/083; H02G 3/08; H01R 13/74; H01R 13/5213; H01R 13/5202; H05K 5/03; H05K 5/00; H05K 5/061; H05K 5/06; F16J 15/02; F16J 15/00; B65D 53/00; B65D 53/06; B65D 53/02
USPC ........... 174/66, 67, 480, 481, 50, 53, 57, 58, 174/137 R, 138 R, 152 R, 153 G; 220/241, 242, 4.02; 248/906; 439/535, 439/536
See application file for complete search history.

(56) References Cited

U.S. PATENT DOCUMENTS 5,280,135 A * 1/1994 Berlin ..................... H02G 3/14
174/67
6,891,104 B2 5/2005 Dinh
(Continued)

FOREIGN PATENT DOCUMENTS

CN 201515575 U 6/2010

OTHER PUBLICATIONS

Pelican CE3180 Vault Series Tablet Case for iPad® Mini, http://www.pelicanprogear.ca/products_pgs/ce3180.php >.

*Primary Examiner* — Angel R Estrada
(74) *Attorney, Agent, or Firm* — Lakshmi Kumaran & Sridharan (57) ABSTRACT

In an example, a sealing member includes a solid body portion and a peripheral beading hinged to the solid body portion. The peripheral beading has an inner perimeter corresponding to an outer perimeter of the solid body portion. Further, in a protracted position, the peripheral beading is to fit around an edge of the solid body portion bearing an interference fit with the solid body portion.

15 Claims, 8 Drawing Sheets

(51) Int. Cl.
    *F16J 15/02*       (2006.01)
    *H01R 13/52*       (2006.01)

(56)            References Cited

U.S. PATENT DOCUMENTS 7,025,220  B2    4/2006   Verespej et al.
    7,227,079  B2 *  6/2007   Noest ................ H01R 13/5213
                                                        174/50
    7,459,632  B2 *  12/2008  Bowman .............. E04F 19/083
                                                        174/482
    7,464,814  B2    12/2008  Carnevali
    7,728,226  B2 *  6/2010   Drane .................... H02G 3/088
                                                        174/66
    7,851,703  B2    12/2010  Drane
    8,226,131  B1    7/2012   Bruce et al.
    8,811,001  B2    8/2014   Iwamoto et al.
    8,963,001  B2 *  2/2015   Shotey .................... H05K 5/03
                                                        174/67
    9,276,389  B1 *  3/2016   Elbaz ...................... H02G 3/14
    9,325,161  B2 *  4/2016   Dahl ....................... H02G 3/10
    9,560,784  B1 *  1/2017   Elbaz .................... H02G 3/088
    2014/0262847 A1  9/2014   Yang
    2016/0054561 A1  2/2016   De Groot et al.

\* cited by examiner

SEALING MEMBERS

BACKGROUND

Electrical and electronic components of devices are susceptible to being damaged by ingress of contaminants, such as dust or water. Therefore, these components are, generally, protected during operation from such damage by providing a cover, such as a hinged lid. The cover can also be used to access the components when servicing or repairing is to be done. Further, to prevent ingress of contaminants when the cover is closed, a gasket is provided at the interface between the cover and the portion of the device which is shielded by the cover.

BRIEF DESCRIPTION OF FIGURES

The detailed description is provided with reference to the accompanying figures. It should be noted that the description and the figures are merely examples and are not meant to represent the subject matter itself.

DETAILED DESCRIPTION

In order to provide a leak-proof protection to electrical and electronic components of a device from contaminants, for example, moisture and dust, a lining formed of a resilient material is provided on the cover or on the portion of the device which mates with the cover. The lining, also referred to as a gasket, provides a tightly sealed fit between the cover and a body of the device. However, even with the lining, the ingress of contaminants may still happen, and in some cases, the contaminants, such as water, can be accumulated in the lining. Accordingly, when the cover is opened to access the components, the accumulated contaminants may drop on the components leading to an unavoidable damage.

Examples described herein relate to aspects of a sealing member for use with devices, which reduces the ingress of contaminants into the device and, at the same time, protects the accumulated contaminants from entering into the device when a cover of the device is opened. In some examples, the sealing member is made of a resilient material, and is mountable on a mating surface of the cover, the mating surface being the surface which mates with a body of the device when the cover is closed.

In some examples, the sealing member is formed as a two-part component with the two parts hinged together. The sealing member includes a solid body portion which is hinged to a peripheral beading. In a retracted position, i.e., in the position when both the parts of the sealing member are drawn towards each other, the solid body portion is concentric and coplanar to the peripheral beading. In simple words, when the sealing member is in the retracted position the edges of the solid body portion are surrounded by the peripheral beading with an interference fit between the two.

In assembled condition for operation, the peripheral beading can be fixed to the mating surface of the cover of the device and the solid body portion is allowed to suspend freely from the peripheral beading at the hinge. When the cover is closed, the solid body portion of the sealing member fits with a first interference fit into a cavity in the body of the device closing the cavity. The peripheral beading mates with the solid body portion and forms a second interference fit therewith, when the mating portion of the cover mates with the body. Therefore, the sealing member, as described herein, forms two sealed junctures—first between the solid body portion of the sealing member and the cavity of the device, and the second between the solid body portion and the peripheral beading of the sealing member. Hence, a strong and effective fit is achieved, when the cover of the device is dosed providing effective protection from ingress of contaminants.

Further, the interference fit between the sealing member, i.e., the solid body portion, and the cavity of the device is relatively tighter than the interference fit between the solid body portion and the peripheral beading. Accordingly, when the cover of the device is opened, the peripheral beading separates from the solid body portion and can protract from the solid body portion, before the solid body portion separates from the body of the device. In other words, when the cover is lifted, the cavity of the device remains closed because the solid body portion of the sealing member remains fitted therein. Therefore, even if contaminants have accumulated at the peripheral beading of the sealing member which may drop towards the cavity when the cover is opened, the solid body portion of the sealing member prevents ingress of such accumulated contaminants into the cavity.

The above aspects are further described in the figures and in associated description below. It should be noted that the description and figures merely illustrate principles of the examples discussed herein. Therefore, various arrangements that encompass the principles of the examples discussed herein, although not explicitly described or shown herein, can be devised from the description and are included within its scope. Additionally, the word "coupled" is used throughout for clarity of the description and can include either a direct connection or an indirect connection.

Figure 1:
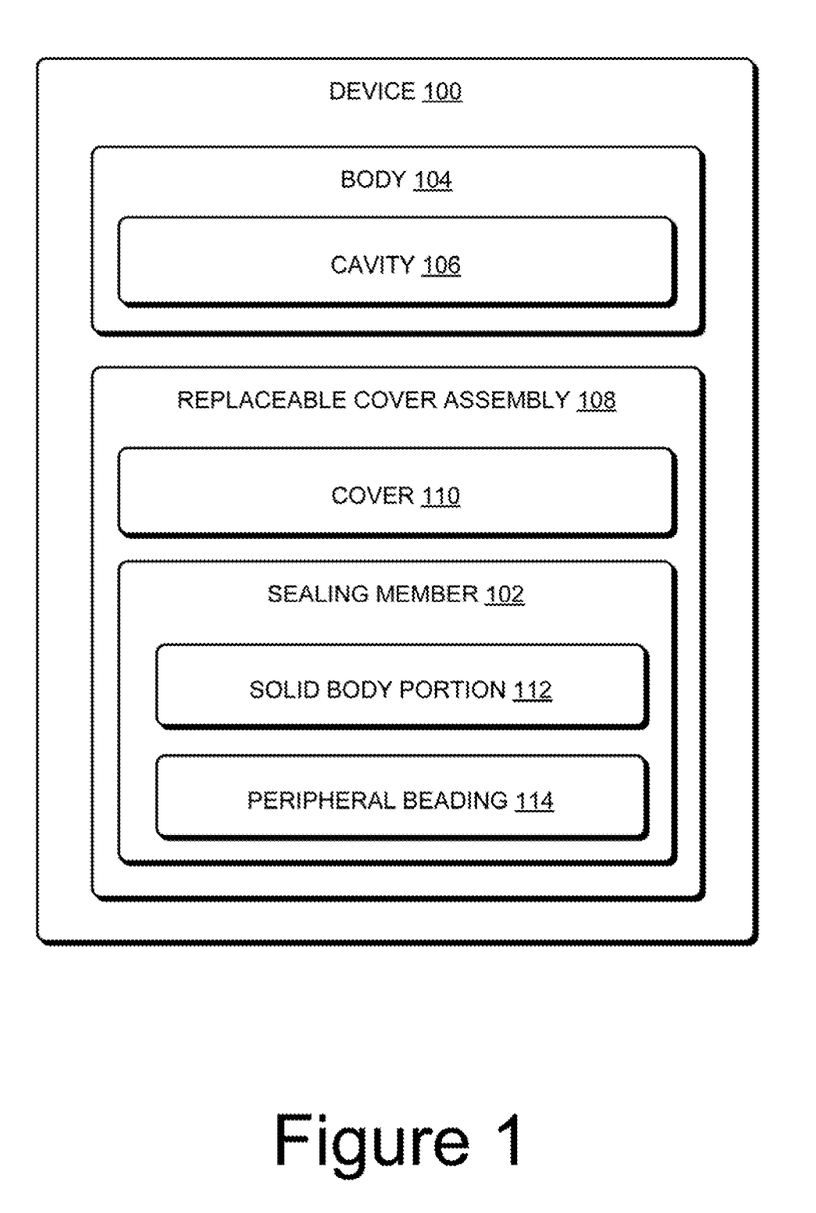
FIG. 1 illustrates a schematic of a device using a sealing member, according to an example.

FIG. 1 illustrates a schematic of a device 100 using a sealing member 102, according to an example. The device 100 can be any electrical, electronic, or similar device having components, which is prone to being damaged by contaminants such as, moisture and dust. The device 100 may further include a mechanical device having components prone to damage by contaminants, or even a storage container used for storing items, such as food products in which the contents are susceptible to be spoilt by contaminants.

In the example illustrated in FIG. 1, the device 100 includes a body 104 for housing various components of the device 100, as described above. The body 104 can have a cavity 106 for accessing the various components of the device 100, for example, during repair or while servicing the device 100. As explained above, the access to the components through the cavity 106 can also expose the components to the elements of nature and to contamination, and thereby, causing damaged. The device 100, therefore, further includes a replaceable cover assembly 108.

As the name suggests, the replaceable cover assembly 108 of the device 100 is disengageable and is a serviceable part of the device 100. The replaceable cover assembly 108 includes a cover 110 and the sealing member 102 is fixed to the cover 110. The sealing member 102 further includes a solid body portion 112 and a peripheral beading 114 which cooperate with each other to provide contaminant proofing and prevent any contaminants from entering into the cavity 106.

Figure 2:
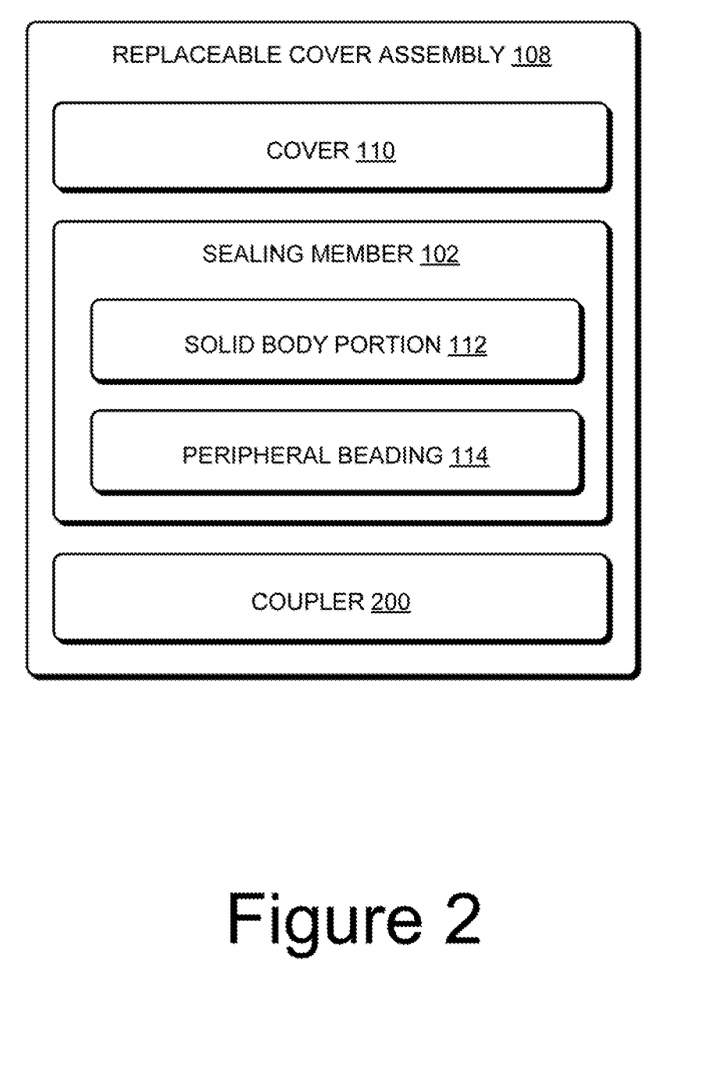
FIG. 2 illustrates a schematic of a replaceable cover assembly for the device, according to an example.

FIG. 2 illustrates a schematic of the replaceable cover assembly 108. For providing serviceability, the replaceable cover assembly 108 can include a coupler 200 for detachably connecting the replaceable cover assembly 108 to the body 104 of the device. Further, the cover 110 of the replaceable cover assembly 108 may act as a lid to mate with and cover the cavity 106 of the device 100. For example, the replaceable cover assembly 108 can be hingedly coupled to the body 104 of the device 100, such that the cover 110 can exhibit pivoting motion about an axis to cover and uncover the cavity 106. The sealing member 102, as mentioned above, can act as a barrier between the interface of the cavity 106 and the cover 110 to prevent the ingress of any contaminants into the cavity, which may otherwise damage the internal components or contents of the device 100. The body portion 112 and the peripheral beading 114 of the sealing member 102 cooperate with each other to protect the entry of moisture, dust, and other such contaminants into the device 100.

The sealing member 102 is fixed to thee cover 110 of the replaceable cover assembly 108. In an example, the peripheral beading 114 of the sealing member 102 is fixed to a mating portion of the cover 110, the mating portion being the part of the cover 110 which cooperates with the body 104 of the device 100 to cover the cavity 106. The solid body portion 112 is coupled, at one location, to the peripheral beading 114, such that the solid body portion 112 and the peripheral beading can exhibit relative motion, for instance, hinged motion, with respect to each other. Accordingly, the peripheral beading 114, when fixed to the cover 110, can move along with the cover 110 relative to the solid body portion 112, when the cover 110 is moved to uncover or mate with the body 104 of the device.

Further, the body portion 112 and the peripheral beading 114 of the sealing member 102 function to prevent entry of contaminants into the device 100. In an example, the body portion 112 and the peripheral beading 114 can create two separate seals to provide dual protection to the device 100 from entry of contaminants. In other words, the body portion 112 can form one seal and the peripheral beading 114 can form another seal, such that even if the contaminant is somehow able to cross one barrier, the other barrier still prevents the contaminant to further find its way into the device 100. The details of the parts of the sealing member 102 are explained later.

Figure 3A:
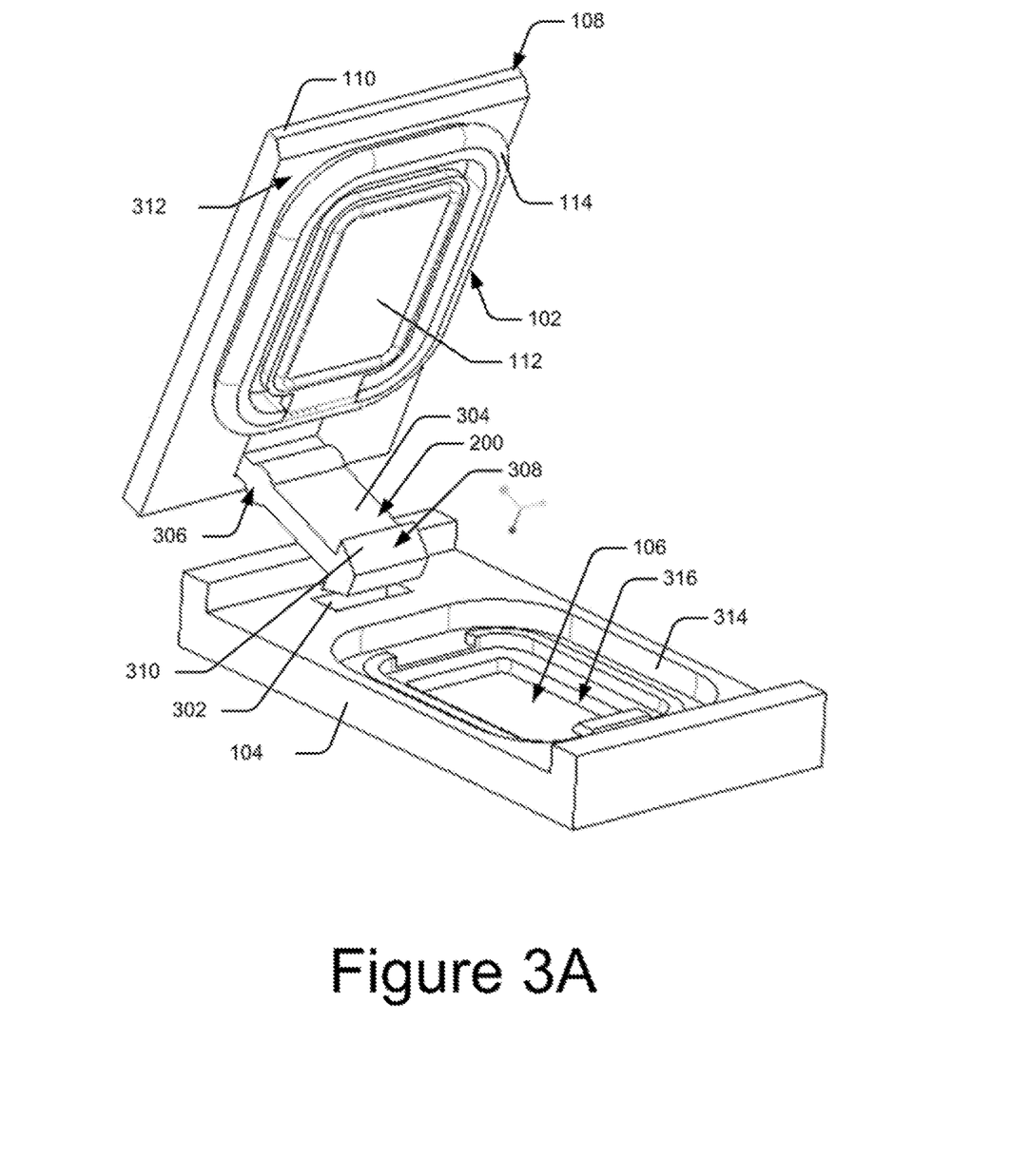
FIGS. 3A, 3B, 3C, and 3D illustrate various views of the replaceable cover assembly, according to an example.
Figure 3B:
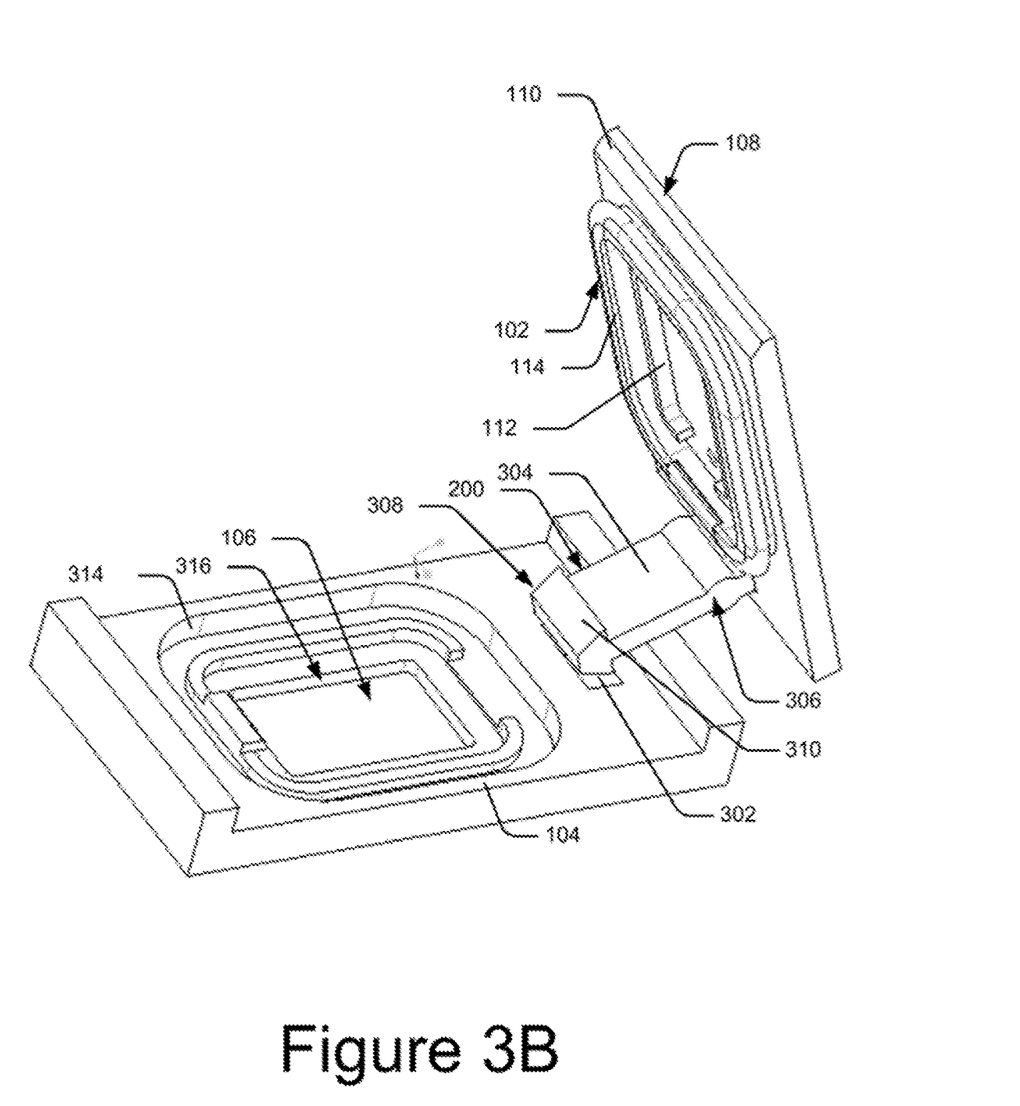
Figure 3C:
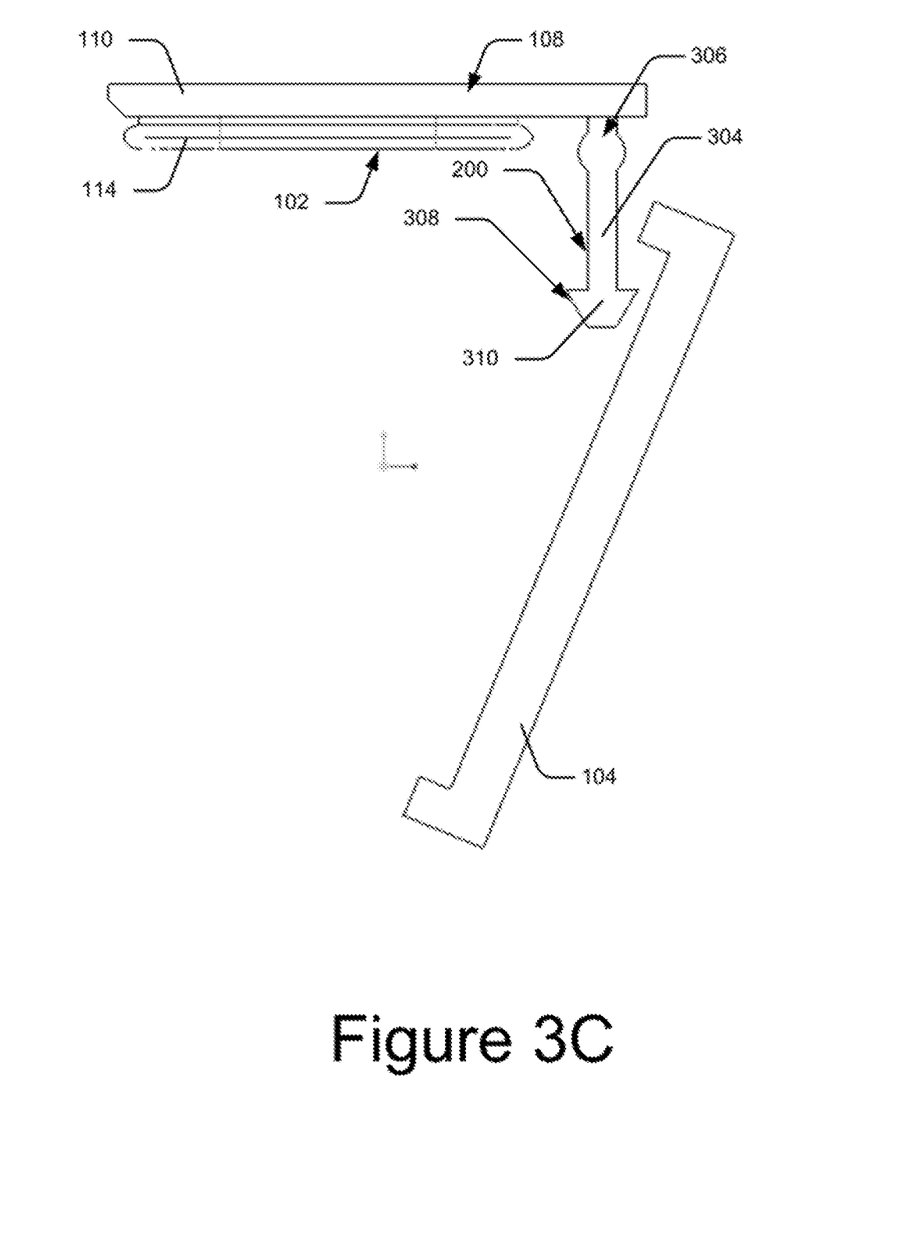
Figure 3D:
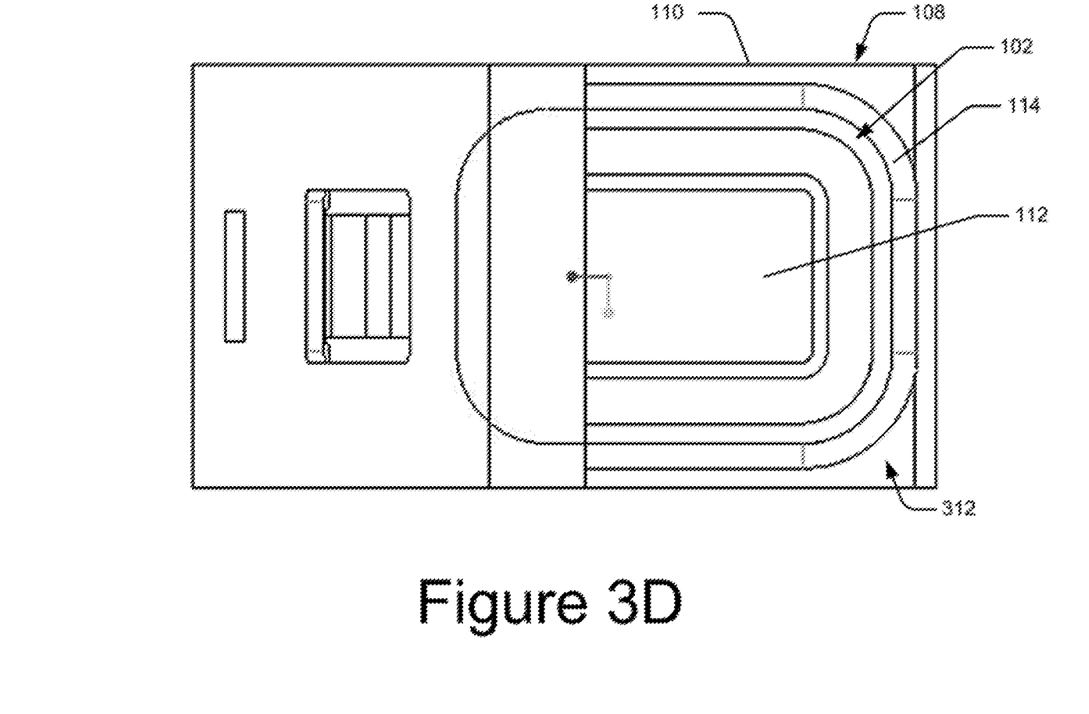

FIGS. 3A, 3B, 3C, and 3D illustrate the replaceable cover assembly 108 for the device 100, according to an example. While FIG. 3A and FIG. 3B illustrate perspective views of the replaceable cover assembly 108, FIG. 3C illustrates a side view of the replaceable cover assembly 108, whereas FIG. 3D illustrates a top view of the replaceable cover assembly 108. For the sake of brevity and ease of understanding, FIG. 3A, FIG. 3B, FIG. 3C, and FIG. 3D are described in conjunction.

The replaceable cover assembly 108 is a serviceable component of the device 100 and, therefore, can be detachably coupled to the device 100, for example, at the body 104 in proximity of the cavity 106. As mentioned earlier, the replaceable cover assembly 108 can include the coupler 200 for detachably connecting the replaceable cover assembly 108 to the body 104 of the device. The coupler 200 can be provided at an end of the cover 110 at which the cover 110 is to hingedly couple to the body 104. Accordingly, the body 104 can have a receptacle 302 for accommodating the coupler 200. In one case, the coupler 200 can have a shaft 304 having a proximal end 306 connected to the cover 110 and a distal end 308 which can be connected at the receptacle 302 in the body 104. The distal end 308 can have a protrusion 310 to provide a snap-fit connection between the coupler 200 and the receptacle 302. Accordingly, for instance, the coupler 200 can be formed of a resilient material and the receptacle 302 can be formed as a slot.

In another case, the coupler 200 can be formed as part of the cover 110 and can be formed of the same material as the cover 110. In such a case, the coupler 200 can be hinged to the cover 110 such that when the coupler 200 is fixed in the receptacle 302, the cover 110 can exhibit hinged movement about the hinge with the coupler 200.

Further, as mentioned previously, the sealing member 102 of the replaceable cover assembly 108 can be fixed to the cover 110. For instance, the sealing member 102 can be fixed to the cover 110 by the peripheral beading 114. In such a case, the cover 110 can be provided with a mating surface 312 which mates with the cavity 104 and the peripheral beading 114 can be fixed to the mating surface 312. When the cover is operated, the components of the sealing member 102, i.e., the solid body portion 112 and the peripheral beading 114, also cooperate with each other and with the body 104 and the cavity 106.

For example, in a protracted position, i.e., when the solid body portion 112 and the peripheral beading 114 are drawn towards each other, the sealing member 102 provides a double barrier for the entry of the contaminants. In the protracted position, the cover 110 covers the cavity and the peripheral beading 114 surrounds an edge, for instance, a lateral edge, of the solid body portion 112. The solid body portion 112 has an outer perimeter which is defined by the lateral edge. The peripheral beading 114, as the name suggests, is formed as a loop that surrounds the solid body portion 112 in the protracted position. The peripheral beading, accordingly, has an inner perimeter which is defined by an inner lateral edge of the loop-like structure and which corresponds to the outer perimeter of the solid body portion 112. In the protracted position, the inner perimeter of the peripheral beading 114 fits around the outer perimeter of the solid body portion 112.

According to an aspect, in the protracted position, the peripheral beading 114 fits around the solid body portion 112 bearing an interference fit with the solid body portion 112. With the sealing member 102 affixed thereto, the cover 110, when closed to cover the cavity 106, causes the peripheral beading 114 to be fitted around the solid body portion 112. Consequently, the sealing member 102 forms three interfaces that the contaminants have to cross to enter the cavity 106.

The first interface can be formed between a support edge 314 of the body 104 and an outer perimeter or edge of the peripheral beading 114, where again, the peripheral beading 114 bears an interference fit with the support edge 314. The support edge 314 can surround an inner part of the body 104 in which the cavity 106 is formed. The second interface can be formed between the solid body portion 112 and the peripheral beading 114, owing to the interference fit therebetween. The third interface can be formed between the solid body portion 112 and an edge 316 of the cavity 106. Accordingly, in one example, the lateral edge of the solid body portion 112 can be broader than the inner lateral edge of the peripheral beading 114 so as to be able to accommodate the interface with the peripheral beading 114 as well as with the edge 316 of the cavity 106.

According to an aspect, at the second interface described above, the peripheral beading 114 can fit around the outer perimeter of the solid body portion 112 bearing a first interference fit with the solid body portion 112 in the protracted position. Further, at the third interface described above, the solid body portion 112 fits into the cavity 106, i.e., forms the interface with the edge 316, bearing a second interference fit with the cavity 106 in the protracted position or, in other words, the closed position of the cover 110.

Further, according to said aspect, the second interference fit is relatively tighter than the first interference fit. Simply put, the effort for disengaging the peripheral beading 114 from the body portion 112 is less than the effort for disengaging the body portion 112 from the edge 316 of the cavity 106, when the cover 110 is removed for exposing the cavity 106. This means that when the cover 110 is lifted, the solid body portion 112 remains fitted on the edge 316 of the cavity 106 to keep the cavity 106 closed, whereas the peripheral beading 114 separates from the solid body portion 112 as the cover 110 hinges away from the cavity 106. Therefore, any contaminants that may have accumulated at the peripheral beading 114 or at the cover 110 and might make their way towards the cavity 106 when the cover 110 is removed still are unable to enter the cavity 106 owing to the snugly fitted solid body portion 112 keeping the cavity 106 covered. Hence, a strong and effective sealing is achieved, providing protection from ingress of contaminants even when the cover 110 is opened.

Upon further application of force on the cover 110, the solid body portion 112 can disengage from the edge 316 of the cavity 106 providing access to the cavity 106. Accordingly, in an example, the hinged connection between the solid body portion 112 and the peripheral beading 114 can be so provided that the relative motion between the two is prevented beyond a certain extent. For instance, a relative pivoting motion of upto 60° may be allowed between the solid body portion 112 and the peripheral beading 114, and any further motion in one component may also cause the movement of the other component.

In one example, the sealing member 102, affixed to the cover 110, can be formed of a resilient material in order to achieve the appropriate interference fits, as explained above, in the closed position of the cover 110, i.e., when the cover 110 is in the protracted position. In said example, the solid body portion 112 can be formed integral to the peripheral beading 114 so that the two parts can exhibit relative hinging motion with respect to each other, owing to the resilient nature of the material they are formed of. In such a case, further, the coupler 200 for detachably connecting the replaceable cover assembly 108 to the body 104 can be formed as part of the sealing member 102. In other words, the sealing member 102 and the coupler 200 can be formed, for example, molded, as a single part.

In other cases, when the sealing member 102 is not formed of a resilient material or is partially formed of a resilient material, the solid body portion 112 and the peripheral beading 114 can be coupled to each other through a hinge joint. For example, in certain cases, the interfacing edges of the solid body portion 112 and the peripheral beading 114, i.e., the edges which form the seals, can be formed of a resilient material and the rest of the portion of the sealing member can be formed of other material(s). The other material(s) can be selected based on various factors, such as the design of the device, the material of the cover 110, strength of the material, aesthetic appeal, or depending on materials that a user might favor.

Figure 4:
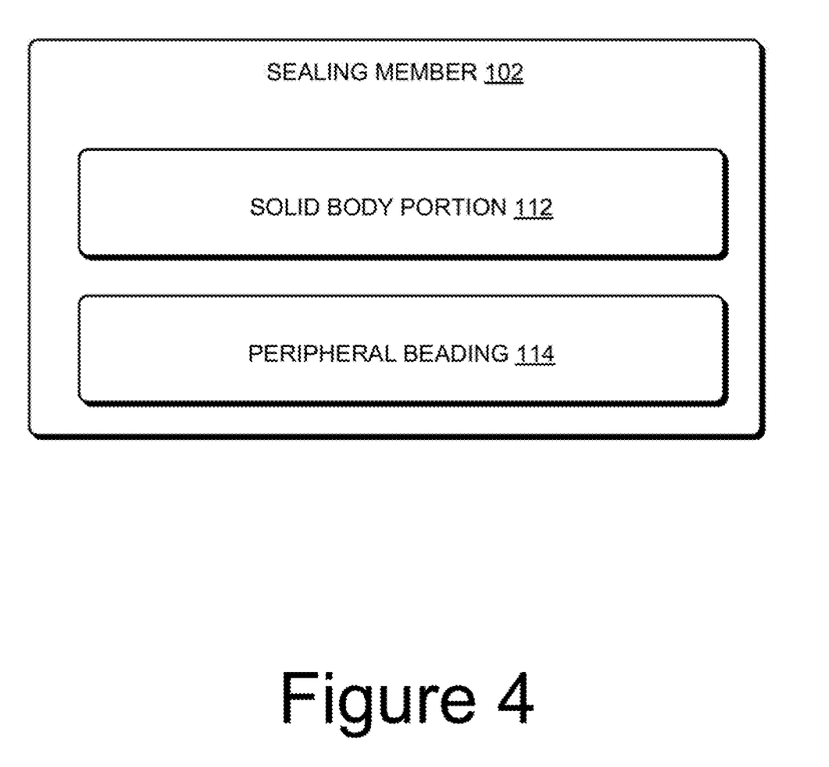
FIG. 4 illustrates a schematic of the sealing member for the device, according to an example.

FIG. 4 illustrates a schematic of the sealing member 102, in accordance with an example. As has been explained above, the sealing member has the solid body portion 112 and a peripheral beading 114 hinged to each other for relative motion, for example, relative pivotal motion, with respect to each other in retracted position. The inner perimeter corresponds to the outer perimeter of the solid body portion 112, and in the protracted position, the peripheral heading 114 is to fit around an edge of the solid body portion 112 bearing an interference fit with the solid body portion 112. In other words, the inner perimeter of the peripheral beading 114 fits around the outer perimeter of the solid body portion 112 bearing an interference fit.

Figure 5:
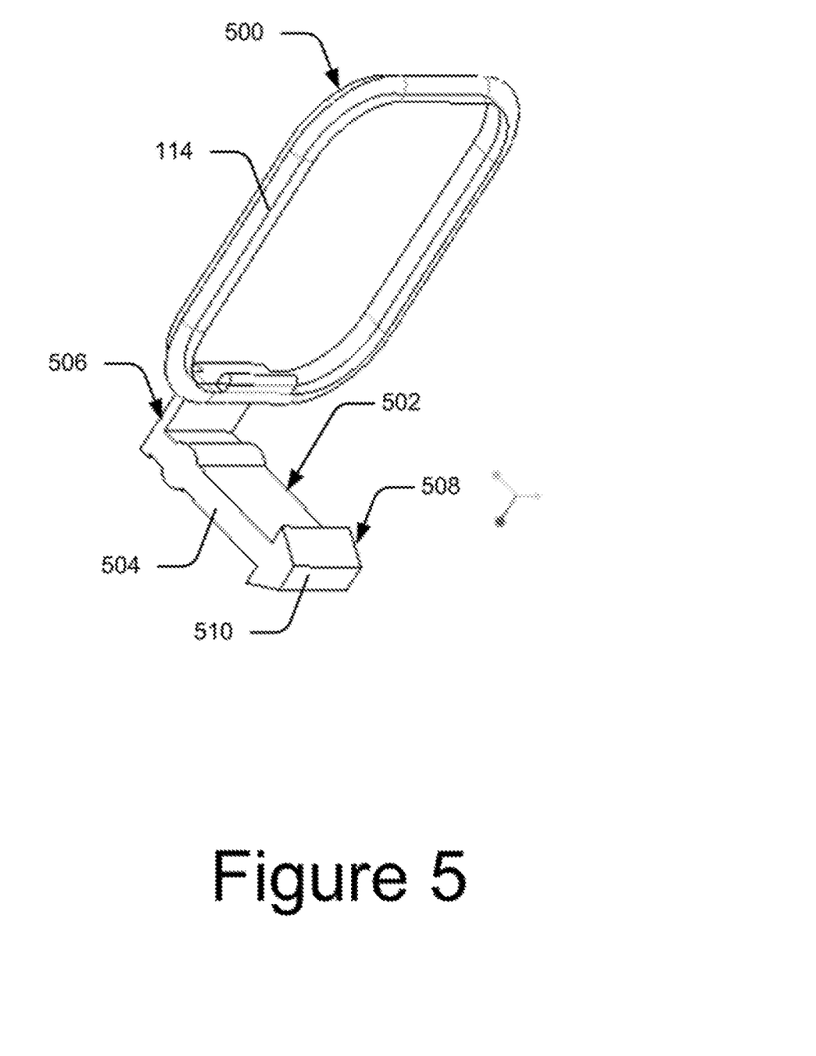
FIG. 5 illustrates a peripheral beading of the sealing member, in accordance with an example.

FIG. 5 illustrates the peripheral beading 114, in accordance with an example. In said example, the peripheral beading 114 is formed separate from the solid body portion 112. As shown, the peripheral beading 114 is in the shape of a gasket which is to fit around the solid body portion 112 in the protracted position of the sealing member 102. For operation, as explained earlier, the sealing member 102 is fixed to a mating surface of another component, such as the cover 110. Accordingly, the peripheral beading 114, as shown in FIG. 5, can include an attaching surface 500 to fix the sealing member 102 at the peripheral beading 114 to the other component. The attaching surface 500 can be roughened to provide an adequate hold to the cover 110.

Further, as explained previously, the sealing member 102 can include a coupler 200 for detachably connecting to the body 104 of the device 100. In an example, the peripheral beading 114 can be formed as having a connector element 502, which acts as a coupler, to detachably couple the sealing member 102 to another body, such as the device 100. The connector element 502 can be formed as a separate, part of integrally formed with the peripheral beading 114.

The connector element 502, similar to the coupler 200, can have a shaft 504 having a proximal end 506 connected to the peripheral beading 114 and a distal end 508 which can be connected to another body, such as the receptacle 302 in the body 104 of the device 100. The distal end 508 can have a protrusion 510 to provide a snap-fit connection between the connector element 502 and the other body. As for the coupler 200, the connector element 502 can too be formed of a resilient material, such as rubber.

Although aspects of the ling member 102 and those of the replaceable cover assembly 108 and the device 100 have been described in language specific to structural features and/or methods, it is to be understood that the appended claims are not limited to the specific features or methods described. Rather, the specific features and methods are disclosed as examples of the sealing member 102, the replaceable cover assembly 108, and the device 100.

We claim:

1. A sealing member comprising:
a solid body portion; and
a peripheral beading hinged to the solid body portion, the peripheral beading having an inner perimeter corresponding to an outer perimeter of the solid body portion, wherein, in a protracted position, the peripheral beading is to fit around an edge of the solid body portion bearing an interference fit with the solid body portion.

2. The sealing member as claimed in claim 1 formed of a resilient material.

3. The sealing member as claimed in claim 1, wherein the peripheral beading comprises an attaching surface to fix the peripheral beading to another component.

4. The sealing member as claimed in claim 1, comprising a connector element to detachably couple the sealing member to another body.

5. The sealing member as claimed in claim 4, wherein the connector element comprises a shaft and a protrusion at a distal end of the shaft to form a snap-fit with the other body.

6. A replaceable cover assembly for a device, the replaceable cover assembly comprising:
   a cover to cover a cavity of the device;
   a sealing member fixed to the cover, the sealing member comprising:
      a solid body portion; and
      a peripheral beading fixed to the cover and hingedly coupled to the solid body portion, the peripheral beading having an inner perimeter corresponding to an outer perimeter of the solid body portion, wherein, in a protracted position, the peripheral beading is to fit around an edge of the solid body portion bearing an interference fit with the solid body portion; and
   a coupler to detachably connect the cover to the device.

7. The replaceable cover assembly as claimed in claim 6, wherein the coupler is a connector element of the sealing member and is formed of a resilient material.

8. The replaceable cover assembly as claimed in claim 7, wherein the connector element comprises a shaft and a protrusion at a distal end of the shaft to form a snap-fit with the device.

9. The replaceable cover assembly as claimed in claim 6, wherein the cover comprises a mating surface to mate with the cavity of the device, and wherein the peripheral beading comprises an attaching surface to fix the peripheral beading to the mating surface of the cover.

10. The replaceable cover assembly as claimed in claim 6, wherein the sealing member is formed of a resilient material.

11. A device comprising:
    a body having a cavity;
    a replaceable cover assembly comprising:
       a cover to cover the cavity;
       a sealing member fixedly attached to the cover, the sealing member comprising:
          a solid body portion; and
          a peripheral beading fixed to the cover and hingedly coupled to the solid body portion, the peripheral beading having an inner perimeter corresponding to an outer perimeter of the solid body portion, wherein, in a protracted position, the peripheral beading is to fit around an edge of the solid body portion bearing a first interference fit with the solid body portion, and the solid body portion is to fit into the cavity of the device bearing a second interference fit with the cavity.

12. The device as claimed in claim 11, wherein the second interference fit is relatively tighter than the first interference fit.

13. The device as claimed in claim 11, wherein the body comprises a receptacle and the replaceable cover assembly comprises a coupler to detachably connect the replaceable cover assembly to the receptacle.

14. The device as claimed in claim 13, wherein the coupler or the receptacle or both are formed of a resilient material.

15. The device as claimed in claim 13, wherein the cover comprises a mating surface to mate with the cavity of the device, and wherein the peripheral beading comprises an attaching surface to fix the peripheral beading to the mating surface of the cover.

\* \* \* \* \*